(12) United States Patent
Clingman et al.

(10) Patent No.: US 7,741,757 B2
(45) Date of Patent: Jun. 22, 2010

(54) ENERGY SHUTTLE BASED HIGH ENERGY PIEZOELECTRIC APPARATUS AND METHOD

(75) Inventors: Dan J. Clingman, Auburn, WA (US); Darin J. Arbogast, Seattle, WA (US)

(73) Assignee: The Boeing Company, Chicago, IL (US)

( * ) Notice: Subject to any disclaimer, the term of this patent is extended or adjusted under 35 U.S.C. 154(b) by 248 days.

(21) Appl. No.: 11/939,134

(22) Filed: Nov. 13, 2007

(65) Prior Publication Data

US 2009/0121587 A1  May 14, 2009

(51) Int. Cl.
*H01L 41/113* (2006.01)
(52) U.S. Cl. ....................................... 310/339
(58) Field of Classification Search ................... 310/339
See application file for complete search history.

(56) References Cited

U.S. PATENT DOCUMENTS

| | | | | |
|---|---|---|---|---|
| 2,921,252 A | * | 1/1960 | Schiavone | 322/2 R |
| 3,819,963 A | * | 6/1974 | Kondo et al. | 310/339 |
| 4,853,580 A | * | 8/1989 | Sula | 310/339 |
| 6,310,428 B1 | * | 10/2001 | Pulli et al. | 310/339 |
| 7,005,778 B2 | | 2/2006 | Pistor | |
| 2002/0185937 A1 | * | 12/2002 | Heim et al. | 310/339 |
| 2005/0022619 A1 | | 2/2005 | Clingman et al. | |
| 2006/0175937 A1 | | 8/2006 | Clingman et al. | |
| 2006/0202592 A1 | | 9/2006 | Ruggeri et al. | |

* cited by examiner

*Primary Examiner*—Thomas M Dougherty
(74) *Attorney, Agent, or Firm*—Harness, Dickey & Pierce, P.L.C.

(57) ABSTRACT

An energy harvester apparatus that includes a piezoelectric beam having opposing first and second ends, with the first end being fixedly supported to a support structure. A negative spring force subsystem has a first end fixedly secured against movement, and a second end secured to the second end of said piezoelectric beam. The negative spring force subsystem includes a linkage system and a biasing element operably associated with the linkage system for applying an adjustable, negative spring force to the piezoelectric beam to soften the piezoelectric beam. The negative spring force subsystem is adjusted to flex the beam sufficiently to overcome the inherent stiffness of the beam such that two stable positions for the beam are created. The beam is therefore able to oscillate between the two stable positions in an over center fashion in response to a low magnitude vibration signal. In various embodiments the system is implemented to provide an input drive signal to control various types of external devices.

21 Claims, 3 Drawing Sheets

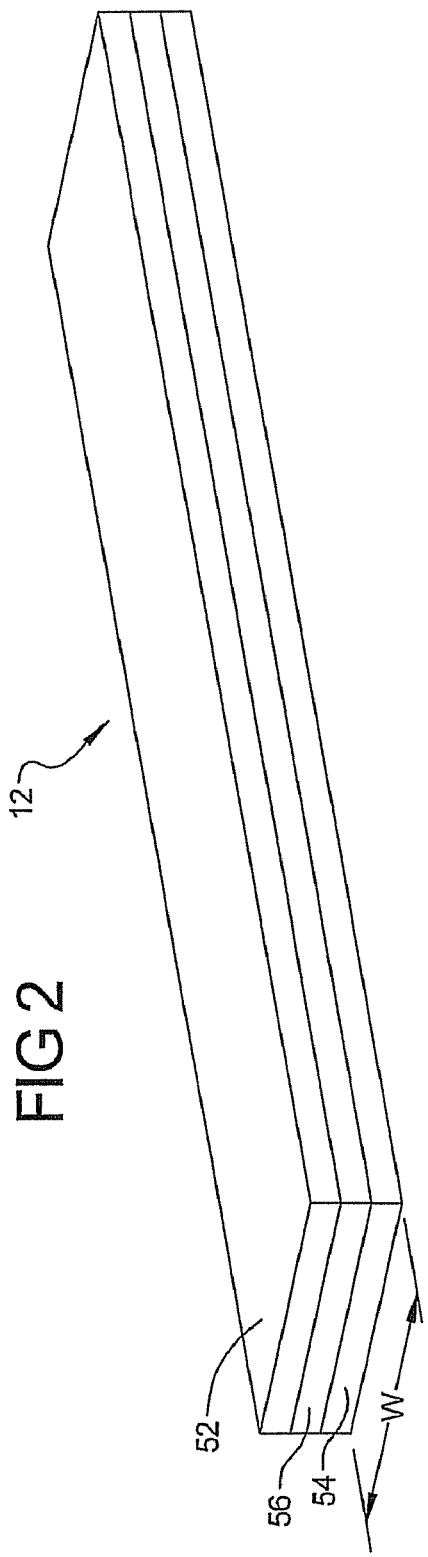
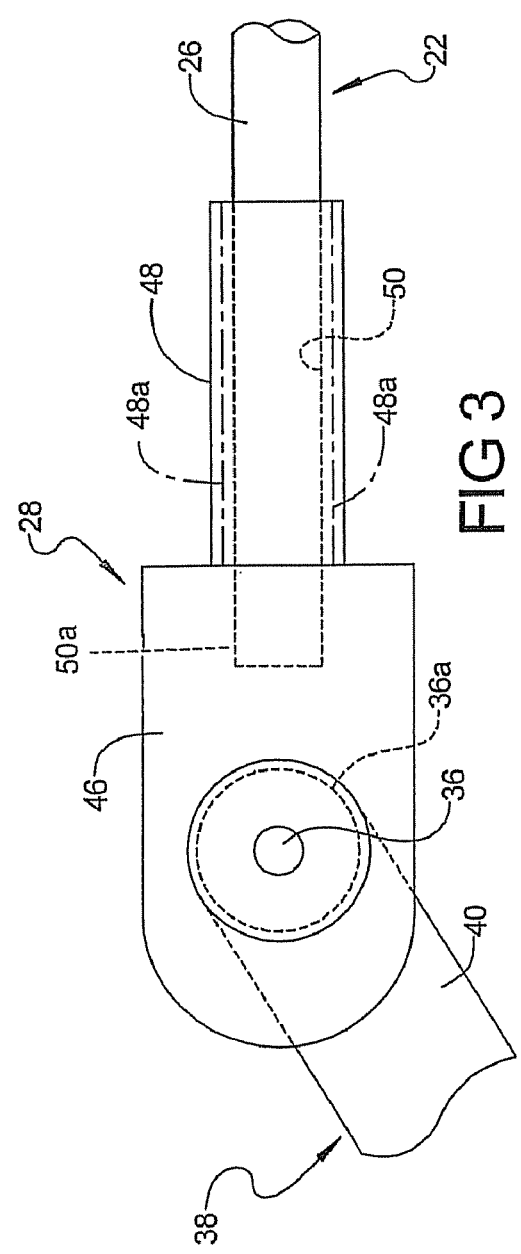

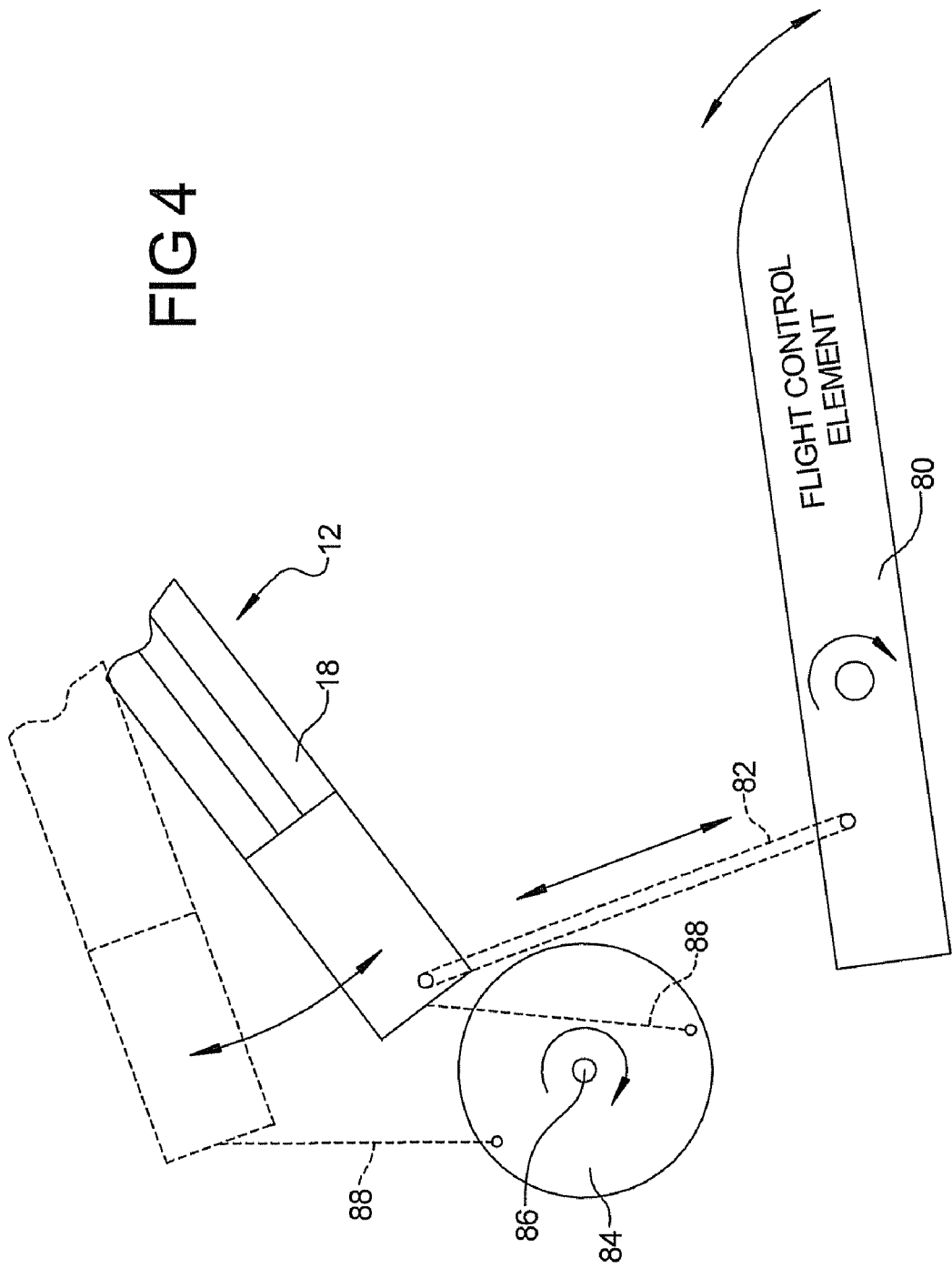

ENERGY SHUTTLE BASED HIGH ENERGY PIEZOELECTRIC APPARATUS AND METHOD

FIELD

The present disclosure relates to piezoelectric devices and methods, and more particularly to piezoelectric motors and energy harvesting devices and methods, and more particularly to an energy harvesting apparatus and method that generates a negative spring force to overcome the inherent stiffness in a piezoceramic beam.

BACKGROUND

The statements in this section merely provide background information related to the present disclosure and may not constitute prior art.

Piezoceramic based motors, actuators and energy harvesters are rapidly gaining popularity for diverse applications where either energy harvesting is performed, or where the use of a piezoceramic element is being used to control movement of another element, for example an actuator.

The following United States patents, all owned by the Boeing Company, are directed to piezoelectric technology and/or piezoelectric controlled devices, and all are hereby incorporated by reference into the present disclosure: U.S. Pat. Nos. 6,894,460; 6,858,970; 6,563,250; 6,307,301; 6,265,810; and 6,320,707.

One limitation with bimorph piezoceramic beams employed in energy harvesting and various control applications is the inherent stiffness of the piezoceramic material. This stiffness must be overcome before a piezoceramic beam is able to vibrate. This limitation tends to make a piezoceramic beam less sensitive to small amplitudes of vibration energy, and also tends to limit the displacement of a free end of the beam in response to vibration energy, or in response to an electrical signal applied to the piezoceramic beam.

SUMMARY

In one aspect the present disclosure relates to an energy harvester apparatus. The apparatus may comprise an electrostrictive beam having opposing first and second ends, with the first end being fixedly supported to a support structure. A negative spring force subsystem may be included that has a first end fixedly secured against movement, and a second end secured to the second end of the electrostrictive beam. The negative spring force subsystem may have its first end coupled adjacent the first end of the electrostrictive beam, and the second end of the negative spring force generating subsystem may be moveable with the second end of the electrostrictive beam. The negative spring force subsystem may include a linkage system and a biasing element operably associated with the linkage system. The biasing element may apply an adjustable negative spring force to the electrostrictive beam to soften the electrostrictive beam.

In another aspect the present disclosure is directed to an energy harvester apparatus that may comprise a bimorph piezoceramic beam having opposing first and second ends, with the first end being fixedly supported from a support structure. A negative spring force subsystem may have a first end fixedly secured against movement, and a second end secured to the second end of the piezoelectric beam. The negative spring force subsystem may include a rod; a linear slide assembly operatively coupled to the rod; a tensioner component adapted to be fixedly secured to the rod at a desired position on the rod; a biasing element positioned over the rod between the tensioner component and the linear slide assembly for applying an adjustable biasing force to the linear slide assembly; and a linkage member coupled at a first end pivotally to the linear slide assembly and at a second end to the second end of the bimorph piezoelectric beam. The biasing element may bend the bimorph piezoelectric beam sufficiently to overcome an inherent stiffness of the piezoceramic beam and to enable the second end of the beam to move readily, in oscillating fashion, between two stable positions in response to vibration energy.

In another aspect the present disclosure may involve a piezoelectric apparatus comprising a piezoelectric beam having opposing first and second ends. The first end may be fixedly supported at a support structure. A negative spring force subsystem may be included that has a first end fixedly secured against movement adjacent the first end of the piezoelectric beam, and a second end secured to the second end of the piezoelectric beam. The negative spring force subsystem may include a linkage system and a biasing element. The biasing element may be operably associated with the linkage system for applying an adjustable negative spring force to the piezoelectric beam to compress and soften the piezoelectric beam and enhance oscillating movement of the piezoelectric beam between two stable positions. A device having an input operatively coupled to the second end of the piezoelectric beam may be driven by the oscillating motion of the second end of the piezoelectric beam.

In still another aspect the present disclosure may be directed to an energy harvesting method that comprises supporting a first end of a piezoelectric beam fixedly from a support structure. A negative spring force generating subsystem may be used that has a first end thereof coupled fixedly adjacent the first end of the piezoelectric beam, and a second end thereof coupled to a second end of the piezoelectric beam, to apply a negative spring force to the piezoelectric beam. The negative spring force may flex the beam sufficiently to overcome a stiffness of the beam, and further such that the second end of the piezoelectric beam is able to move readily in an over center fashion between two stable positions. The second end of the piezoelectric beam may be used to at least one of control and drive an external device.

In still another aspect the present disclosure may be directed to a method for forming a drive implement responsive to electrical input energy. The method may involve supporting a first end of a piezoelectric beam fixedly from a support structure; using a negative spring force generating subsystem having a first end coupled fixedly adjacent the first end of the piezoelectric beam, and a second end coupled to a second end of the piezoelectric beam, to apply a compressive, negative spring force to the piezoelectric beam. The negative spring force may flex the beam sufficiently to overcome a stiffness of the piezoelectric beam, and such that the second end of the piezoelectric beam is able to move readily in an over center fashion between two stable positions in response to an application and removal of electrical signals to the piezoelectric beam. The second end of the piezoelectric beam may be used to drive an external device.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The drawings described herein are for illustration purposes only and are not intended to limit the scope of the present disclosure in any way.

FIG. 2 is a perspective view of the bimorph piezoceramic beam shown in FIG. 1;

FIG. 3 is a an enlarged view of the linear slide mechanism shown in FIG. 1; and

FIG. 4 shows a side view of the free end of the piezoceramic beam of FIG. 1 being used as an input to drive a flight control element or a crankshaft.

DETAILED DESCRIPTION

Figure 1:
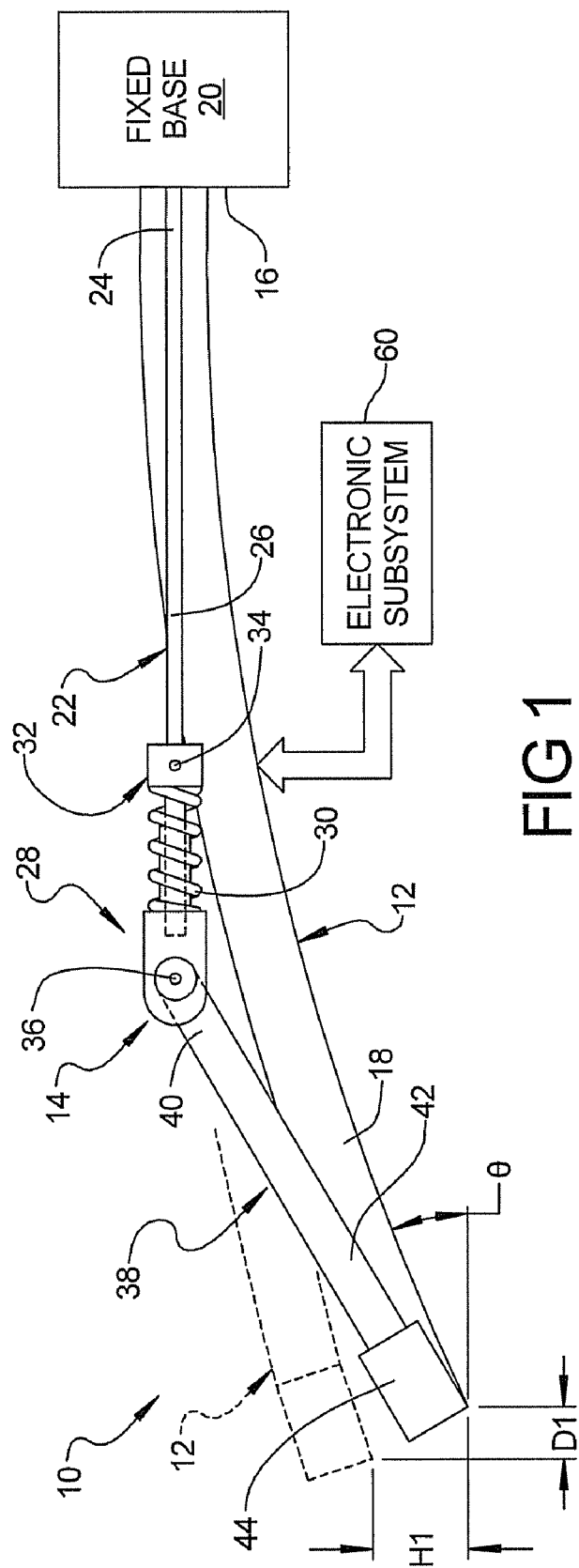
FIG. 1 is a side view of one implementation of a specific embodiment of the present disclosure, and showing the two stable positions of a piezoceramic beam of the system in solid and dashed lines.

The following description is merely exemplary in nature and is not intended to limit the present disclosure, application, or uses.

Referring to FIG. 1, there is shown an energy harvesting system 10 in accordance with one embodiment of the present disclosure. The system 10 may alternatively be used to form a drive implement, for example an actuator.

In this exemplary embodiment the system 10 includes an electrically sensitive (e.g., electrostrictive) beam, for example a bimorph piezoceramic beam 12, and a negative spring force subsystem 14 operatively coupled to the beam 12. The beam 12 has a first end 16 and a second end 18. The first end 16 is fixedly coupled or supported from a base 20 or other support structure so that the first end 16 is held rigidly against movement. The second end 18 is free to move.

The negative spring force subsystem 14 includes a tensioner member in the form of a rod 22. The rod 22 has a first end 24 that is coupled to the base 20 and a second end 26 that is operatively coupled to a linear slide mechanism 28. The rod 22 may be formed by steel, aluminum or any other material that is structurally rigid and resistant to bending. A biasing element, in this example a coil spring 30, is disposed over the second end 26 of the rod and abuts a portion of the linear slide mechanism 28. A tubular tension nut 32 is also positioned over the rod 22 and includes a set screw 34 that enables the tension nut 32 to be secured fixedly on the rod 22 at a desired longitudinal position.

With further reference to FIGS. 1 and 3, the linear slide mechanism 28 also includes a pivot rod 36 supported by a rotary bearing 36a. The pivot rod 36 is coupled to a first end 40 of a swing arm 38. A second end 42 of the swing arm 38 is fixedly coupled via a plate 44 (FIG. 1) or other suitable coupling element to the second end of 18 the bimorph piezoceramic beam 12. The swing arm 38 is also formed from a rigid material such as steel, aluminum or possibly from composites, such that it is highly resistant to flexing.

With brief reference to FIG. 3, The linear slide mechanism 28 includes a body portion 46 having a tubular neck portion 48 having a bore 50. The bore 50 receives a portion of the second end 26 of the rod 22 therein. The bore 50 may extend partially into the body 46 as indicated by the dashed lines 50a within the body portion 46. Preferably, the linear slide mechanism 28 is able to move at least between about 0.01 inch 0.1 inch (0.25mm-2.5mm) linearly along the rod 22, along the precise amount of linear movement required will depend in large part on the overall length of the bimorph piezoceramic beam 12 and other factors. The linear slide mechanism 28 may incorporate a linear bearing system 48a within the neck portion 48 to assist in providing smooth sliding movement of the mechanism 28 along the rod 22.

With brief reference to FIG. 2, the bimorph piezoceramic beam 12 is shown in greater detail. The bimorph piezoceramic beam 12 in this example includes piezoceramic layers 52 and 54 that are secured, such as by adhesives, to a substrate layer 56. The piezoceramic layers 52 and 54 may typically range in thickness between about 0.003 inch 0.05 inch (0.0762 mm-1.27 mm). The thickness of the substrate layer 56 is typically no more than about 0.02 inch (0.508 mm). The width "W" may typically range between about 0.1 inch to 5 inches (2.54 mm-12.7 cm). It will be appreciated that the above exemplary dimensions may vary widely to suit the needs of a particular application. Also, the thicknesses of the piezoceramic layers 52 and 54 need not be the same, but instead could differ to tailor the system 10 to a specific application.

Referring again to FIG. 1, during calibration of the system 10 prior to using it for the first time, the tension nut 32 is secured via the set screw 34 at a longitudinal position that applies a precise degree of preload to the bimorph piezoceramic beam 12. By "preload" it is meant a precise amount of tension force to the beam 12 that causes bending of the beam 12 sufficient to overcome the inherent stiffness of the piezoceramic material. In effect, the preload force causes the beam 12 to flex to just past an over center position where the inherent stiffness of the beam 12 is just overcome. This produces two stable positions for the beam 12, one on each side of the over center position. The two stable positions are shown in FIG. 1, with one being in dashed lines and the other in solid lines. With the preload force adjusted to produce the two stable positions as shown in FIG. 1, the beam 12 is be able to oscillate easily back and forth between the two stable positions in response to a very low magnitude vibration energy signal. When an electronic subsystem 60 is electrically coupled to the piezoceramic layers 52 and 54 of the beam 12, the electrical signal generated by the oscillating motion of the beam 12 can be obtained and used for a desired purpose, for example to power an external device.

In the present exemplary embodiment of the system 10, it has been found that the two stable positions can be created if the bimorph piezoceramic beam 12 is preloaded such that force in the compression spring 30 is given by the following equation:

$$F = \frac{EI*\Theta}{4L_{beam}L_{linkarm}\text{Sin}(2*\Theta)}$$

where "EI" is the bending stiffness of the piezoceramic beam, "$L_{beam}$" is the length of the piezoceramic beam, "$L_{linkarm}$" is the length of the link arm and "$\Theta$" is the bend angle of the beam.

Referring further to FIG. 1, it is an advantage that the bimorph piezoceramic beam 12 provides a large vertical displacement component "H1". "D1" is meant to indicate the longitudinal change in the position of the tip of the beam 12. It will be appreciated that generally, the longer the beam 12, the greater the displacements D1 and H1 will be. The energy supplied by the exemplary embodiment per actuation cycle when used as a motor will be significantly larger compared to using the piezoceramic beam 12 without the negative spring force. This is because the displacement of the second (i.e., free) end 18 of the beam 12 can be much larger and the force generated will be nearly constant over the complete cycle of its flexing motion.

Referring now to FIG. 4, the second end 18 of the bimorph piezoceramic beam 12 is shown coupled in a plurality of different manners to drive widely diverse external devices. In the following discussion, it will be understood that the system 10 may use the motion of the second end 18 of the beam 12 to form a linear motor, or alternatively to provide an input signal for the external device. In this regard, the electronic subsystem 60 in FIG. 1 is configured to apply an electrical signal to the beam 12, and more typically a changing polarity electrical signal, to cause an oscillating motion of the second end 18 of the beam 12.

In one exemplary implementation shown in FIG. 4, the motion of the second end 18 of the beam 12 is used to actuate a pivotally mounted flight control element 80 via a suitable link 82 or member.

In another exemplary implementation shown in FIG. 4, the second end 18 of the beam 12 is coupled to a rotationally mounted clement, in this example a crankshaft 84, via a crank arm 88, where the crankshaft 84 rotates about an axis 86 thereof. Thus, the flexing motion of the second end of the beam 12 can be used to provide a rotary drive signal.

From the foregoing it will be appreciated that the system 10 is equally well adapted for use as an energy harvesting system, or as a system that can control or drive an external component, or function as an actuator. The increased displacement of the second end 18 of the beam 12, as a result of the negative spring force subsystem 14 being able to overcome the inherent stiffness of the bimorph piezoceramic beam 12, enables both a greater magnitude electrical signal to be generated from oscillating motion of the second end 18 of the beam, when the system 10 is being used for energy harvesting purposes. Still further, a greater displacement of the second end 12 is produced when the system 10 is configured to drive an external component.

Those skilled in the art will recognize modifications or variations that might be made without departing from the present disclosure. The examples illustrate the various embodiments and are not intended to limit the present disclosure. Therefore, the description and claims should be interpreted liberally with only such limitation as is necessary in view of the pertinent prior art.

What is claimed is:

1. An energy harvester apparatus comprising:
   an electrostrictive beam having opposing first and second ends, with said first end being fixedly supported to a support structure;
   a negative spring force subsystem having a first end fixedly secured against movement, and a second end secured to said second end of said electrostrictive beam;
   said negative spring force subsystem having its said first end coupled adjacent said first end of said electrostrictive beam, and said second end of said negative spring force generating subsystem being moveable with said second end of said electrostrictive beam, said negative spring force subsystem including:
   a linkage system; and
   a biasing element operably associated with said linkage system for applying an adjustable negative spring force to said electrostrictive beam to soften said electrostrictive beam.

2. The apparatus of 1, wherein said negative spring force subsystem provides an over center biasing mechanism that enables said electrostrictive beam to assume either one of two stable positions on opposite sides of a center point disposed between the two stable positions.

3. The apparatus of claim 1, wherein said electrostrictive beam comprises a bimorph piezoceramic beam.

4. The apparatus of claim 1, wherein said linkage system comprises a rotary bearing and a linear slide mechanism, with the rotary bearing being operatively coupled to said second end of said electrostrictive beam.

5. The apparatus of claim 1, wherein said negative spring force subsystem comprises a tensioner member that enables a biasing force applied by said spring to said electrostrictive beam to be adjusted.

6. The apparatus of claim 5, wherein said negative spring force subsystem includes:
   a rod having a first end and a second end, with said first end fixedly secured to said support structure;
   said tensioner having a bore that receives said rod therethrough, said tensioner member being fixedly adjustably positionable on said rod and securable fixedly to said rod;
   a linear slide mechanism operatively coupled to said second end of said rod for moving linearly in opposite directions along a portion of said rod;
   said biasing element forming a coil spring disposed over a portion of said rod between said linear slide mechanism and said tensioner member;
   a swing arm having a first end pivotally coupled to said linear side mechanism, and a second end fixedly coupled to said second end of said electrostrictive beam;
   said biasing force generated by said coil spring being sufficient to bend said electrostrictive beam sufficiently to overcome a stiffness of said beam.

7. The apparatus of claim 1, wherein motion of said second end of said electrostrictive beam is used to form a linear motor.

8. The apparatus of claim 1, further comprising a member for coupling said second end of said electrostrictive beam to an input of a flight control element.

9. The apparatus of claim 1, further comprising a member for coupling said second end of said electrostrictive beam to an input of a rotationally mounted element for driving the rotationally mounted element rotationally.

10. An energy harvester apparatus comprising:
    a bimorph piezoceramic beam having opposing first and second ends, with said first end being fixedly supported to a support structure;
    a negative spring force subsystem having a first end fixedly secured against movement, and a second end secured to said second end of said piezoelectric beam;
    said negative spring force subsystem including:
    a rod;
    a linear slide assembly operatively coupled to said rod;
    a tensioner component adapted to be fixedly secured to said rod at a desired position on said rod;
    a biasing element positioned over said rod between said tensioner component and said linear slide assembly for applying an adjustable biasing force to said linear slide assembly; and
    a linkage member coupled at a first end pivotally to said linear slide assembly and at a second end to said second end of said bimorph piezoelectric beam;
    said biasing element bending said bimorph piezoelectric beam sufficiently to overcome an inherent stiffness of said piezoceramic beam and to enable said second end of said beam to move readily, in oscillating fashion, between two stable positions in response to vibration energy.

11. The apparatus of claim 10, wherein said biasing element comprises a coil spring.

12. The apparatus of claim 10, wherein said negative spring force subsystem is disposed adjacent to said bimorph piezoceramic beam.

13. A piezoelectric apparatus comprising:
- a piezoelectric beam having opposing first and second ends, with said first end being fixedly supported to a support structure;
- a negative spring force subsystem having a first end fixedly secured against movement adjacent said first end of said piezoelectric beam, and a second end secured to said second end of said piezoelectric beam;
- said negative spring force subsystem including:
  - a linkage system; and
  - a biasing element operably associated with said linkage system for applying an adjustable negative spring force to said piezoelectric beam to compress and soften said piezoelectric beam and enhance oscillating movement of said piezoelectric beam between two stable positions; and
  - a device having an input operatively coupled to said second end of said piezoelectric beam and driven by said oscillating motion of said second end of said piezoelectric beam.

14. The apparatus of claim 13, wherein said device comprises a crankshaft.

15. The apparatus of claim 13, wherein said device comprises a flight control panel.

16. The apparatus of claim 13, wherein said piezoelectric beam comprises a bimorph piezoceramic beam.

17. An energy harvesting method comprising:
- supporting a first end of a piezoelectric beam fixedly from a support structure;
- using a negative spring force generating subsystem that has a first end thereof coupled fixedly adjacent the first end of said piezoelectric beam, and a second end thereof coupled to a second end of said piezoelectric beam, to apply a negative spring force to said piezoelectric beam to flex said beam sufficiently to overcome a stiffness of said beam, and such that the second end of said piezoelectric beam is able to move readily in an over center fashion between two stable positions; and
- using said second end of said piezoelectric beam to at least one of control and drive an external device.

18. A method for forming a drive implement responsive to electrical input energy, comprising:
- supporting a first end of a piezoelectric beam fixedly from a support structure;
- using a negative spring force generating subsystem having a first end coupled fixedly adjacent the first end of the piezoelectric beam, and a second end coupled to a second end of said piezoelectric beam, to apply a compressive, negative spring force to said piezoelectric beam to flex said beam sufficiently to overcome a stiffness of said piezoelectric beam, and such that said second end of said piezoelectric beam is able to move readily in an over center fashion between two stable positions in response to an application and removal of electrical signals to said piezoelectric beam; and
- using said second end of said piezoelectric beam to drive an external device.

19. The method of claim 18, wherein using a negative spring force comprises using a biasing spring and a linkage system coupled between said first and second ends of said piezoelectric beam to apply a force sufficient to cause said beam to flex.

20. The method of claim 18, wherein driving an external device comprises driving one of a crankshaft or a flight control element.

21. The method of claim 18, wherein said using a negative spring force generating subsystem comprises using a negative spring force generating subsystem that enables a user adjustable negative spring force to be applied to said piezoelectric beam to overcome an inherent stiffness of piezoelectric beam, to thus enhance a response of said piezoelectric beam to vibration.

* * * * *